United States Patent
Park et al.

(10) Patent No.: US 12,278,133 B2
(45) Date of Patent: Apr. 15, 2025

(54) SUBSTRATE TRANSFERRING UNIT, SUBSTRATE PROCESSING APPARATUS, AND SUBSTRATE PROCESSING METHOD

(71) Applicant: SAMSUNG ELECTRONICS CO., LTD., Suwon-si (KR)

(72) Inventors: Sangjine Park, Suwon-si (KR); Kuntack Lee, Suwon-si (KR); Jihwan Park, Hwaseong-si (KR); Seungmin Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/545,644

(22) Filed: Dec. 19, 2023

(65) Prior Publication Data

US 2024/0120232 A1    Apr. 11, 2024

Related U.S. Application Data

(62) Division of application No. 17/735,723, filed on May 3, 2022, now Pat. No. 11,881,426.

(30) Foreign Application Priority Data

Aug. 31, 2021   (KR) .................. 10-2021-0115806

(51) Int. Cl.
  *H01L 21/687*   (2006.01)
  *G03F 7/40*   (2006.01)
  *G03F 7/20*   (2006.01)

(52) U.S. Cl.
  CPC .......... *H01L 21/68707* (2013.01); *G03F 7/40* (2013.01); *G03F 7/2004* (2013.01)

(58) Field of Classification Search
  CPC ......... H01L 21/68707; H01L 21/67034; G03F 7/40; G03F 7/2004; G03F 7/3021
  See application file for complete search history.

(56) References Cited

U.S. PATENT DOCUMENTS

| | | |
|---|---|---|
| 6,703,316 B2 | 3/2004 | Inoue et al. |
| 7,000,621 B1 | 2/2006 | Verhaverbeke |
| 9,449,857 B2 | 9/2016 | Inadomi |
| 9,831,081 B2 | 11/2017 | Jeong et al. |
| 10,507,516 B2 | 12/2019 | Tanaka |
| 10,593,571 B2 | 3/2020 | Inadomi et al. |

(Continued)

FOREIGN PATENT DOCUMENTS

KR    10-2096954 A    4/2020

*Primary Examiner* — Hung V Nguyen
(74) *Attorney, Agent, or Firm* — Sughrue Mion, PLLC

(57) ABSTRACT

A substrate processing apparatus includes: a first process chamber in which a developing process is performed by supplying a developer to a substrate that is in a dry state; a second process chamber in which a drying process is performed on the substrate by supplying a supercritical fluid to the substrate on which the developing process is performed and which is in a wet state; a third process chamber in which a bake operation is performed on the substrate on which the drying operation is performed and is in a dry state; a fourth process chamber in which a cooling operation is performed on the substrate on which the bake operation is performed and is in a dry state; and a substrate transferring unit configured to transfer the substrate between the first to fourth process chambers.

4 Claims, 12 Drawing Sheets

(56) References Cited

U.S. PATENT DOCUMENTS

| | | | |
|---|---|---|---|
| 10,985,036 B2* | 4/2021 | Kim | H01L 21/68735 |
| 11,101,157 B2* | 8/2021 | Feng | H01L 21/67051 |
| 2012/0064727 A1* | 3/2012 | Oh | H01L 21/67748 |
| | | | 156/345.23 |
| 2019/0273002 A1 | 9/2019 | Gouk et al. | |
| 2020/0219736 A1 | 7/2020 | Aoki et al. | |
| 2021/0008606 A1 | 1/2021 | Park et al. | |

* cited by examiner

SUBSTRATE TRANSFERRING UNIT, SUBSTRATE PROCESSING APPARATUS, AND SUBSTRATE PROCESSING METHOD

CROSS-REFERENCE TO RELATED APPLICATION

This application is a Divisional Application of application Ser. No. 17/735,723, filed on May 3, 2022, which claims priority under 35 U.S.C. § 119 to Korean Patent Application No. 10-2021-0115806, filed on Aug. 31, 2021, in the Korean Intellectual Property Office, the disclosure of which is incorporated by reference herein in its entirety.

BACKGROUND

The present disclosure relates to a substrate transferring unit, a substrate processing apparatus, and a substrate processing method, and more particularly, to a substrate transferring unit, a substrate processing apparatus, and a substrate processing method, whereby particle defects on a substrate in a manufacturing process of a semiconductor device may be reduced.

As scaling of a semiconductor device is demanded, an extreme ultra-violet (EUV) lithography method using very small EUV wavelengths (about 13.5 nm) has been suggested. By using the EUV lithography, a photoresist pattern having a relatively small horizontal dimensions and a high aspect ratio may be formed. To prevent the collapse of photoresist patterns during a process of forming fine photoresist patterns, a technique of using a supercritical fluid is being researched. However, issues such as addressing particle defects on a substrate in a semiconductor device manufacturing process need to be further researched.

SUMMARY

Example embodiments provide a substrate processing apparatus and a substrate processing method, in which an area taken by a substrate transferring unit is not relatively large and particle defects on a substrate in a semiconductor device manufacturing process may be significantly reduced.

The objectives to be solved are not limited to the above-mentioned objectives, and other objectives not mentioned herein will be clearly understood by those skilled in the art from the following description.

According to an aspect of an example embodiment, there is provided a substrate processing apparatus including a first process chamber configured to perform a developing process by supplying a developer to a substrate that is in a dry state, a second process chamber configured to perform a drying process on the substrate by supplying a supercritical fluid to the substrate on which the developing process is performed and which is in a wet state, a third process chamber configured to perform a baking process on the substrate on which the drying process is performed and is in the dry state, a fourth process chamber configured to perform a cooling process on the substrate on which the baking process is performed and is in the dry state, and a substrate transferring unit configured to transfer the substrate between the first process chamber, the second process chamber, the third process chamber, and the fourth process chamber, wherein the substrate transferring unit includes a first blade configured to transfer the substrate that is in the dry state, a second blade configured to transfer the substrate that is in the wet state, and a carrier configured to temporarily store the substrate that is in the dry state.

According to another aspect of an example embodiment, there is provided a substrate transferring unit including a first blade configured to transfer a substrate that is in a dry state; a second blade provided below the first blade and configured to transfer the substrate that is in a wet state; a first cover provided above the first blade; a second cover provided between the first blade and the second blade; and a carrier configured to temporarily store the substrate that is in the dry state.

According to another aspect of an example embodiment, there is provided a substrate processing method including performing a developing process by loading a substrate that is in a dry state into a first process chamber by using a first blade of a substrate transferring unit; after performing the developing process, performing a drying process by loading the substrate that is in a wet state into a second process chamber by using a second blade of the substrate transferring unit; after performing the drying process, performing a baking process by loading the substrate that is in the dry state, into a third process chamber by using the first blade; and after performing the baking process, performing a cooling process by loading the substrate that is in the dry state into a fourth process chamber by using the first blade, wherein in each of the performing the developing process, the performing the drying process, and the performing the baking process, the substrate that is in the dry state and is on standby for a process is transferred to a carrier by using the first blade.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Hereinafter, example embodiments of the inventive concept will be described in detail with reference to the attached drawings.

Figure 1:
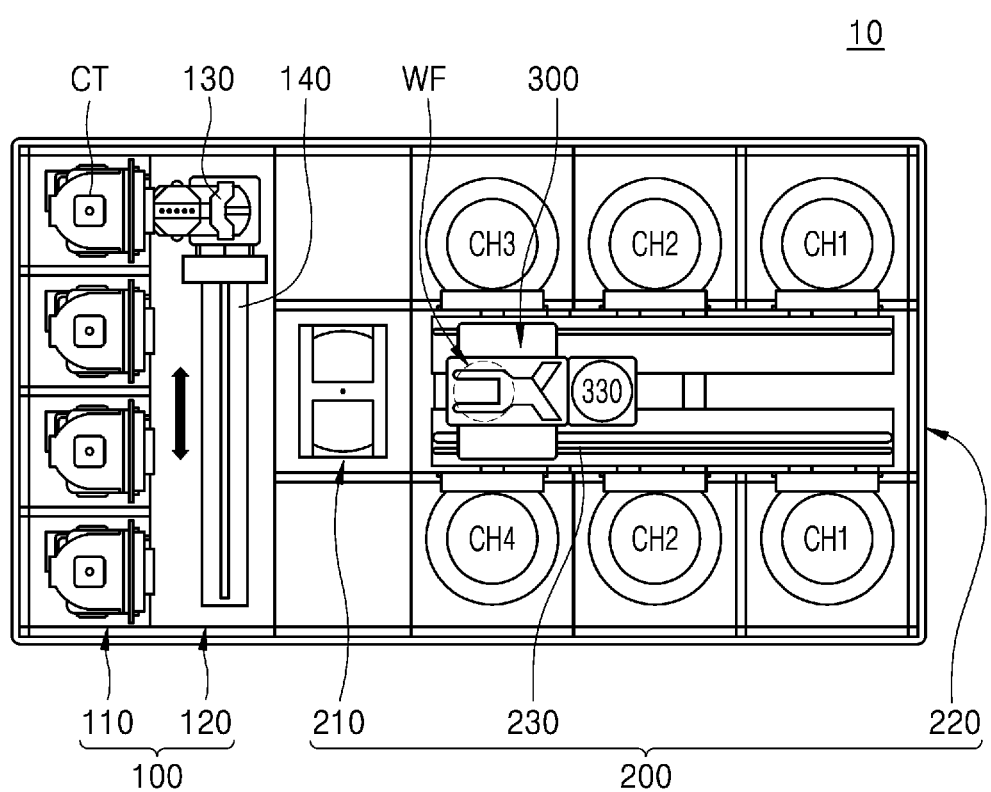
FIG. 1 is a cross-sectional view illustrating a substrate processing apparatus according to an example embodiment.

FIG. 1 is a cross-sectional view illustrating a substrate processing apparatus according to an example embodiment.

Referring to FIG. 1, a substrate processing apparatus 10 may include an index module (an index apparatus) 100, a processing module (a processing apparatus) 200, and a substrate transferring unit (a substrate transferring apparatus) 300.

The index module 100 may include a load port 110 and a transfer frame 120. The load port 110, the transfer frame 120, and the processing module 200 may be sequentially arranged in a line in one direction. For example, the direction in which the load port 110, the transfer frame 120, and the processing module 200 are arranged in a line may be defined as an X-direction, and a horizontal direction perpendicular to the X-direction is defined as a Y-direction, and a direction perpendicular to each of the X-direction and the Y-direction is defined as a Z-direction.

A container CT in which a substrate WF is accommodated is seated on the load port 110. The load port 110 includes a plurality of load ports 110, and may be arranged in a line in the Y-direction. Although four load ports 110 are illustrated in the drawing, the number of load ports 110 may be increased or decreased according to conditions such as the process efficiency and/or an installation area of the processing module 200. The container CT may include a plurality of slots configured to support an edge of the substrate WF. The plurality of slots may be spaced apart from each other in the Z-direction, and accordingly, a plurality of substrates WF are mounted in the container CT in the Z-direction. The container CT may be, for example, a front opening unified pod (FOUP).

The transfer frame 120 may transfer the substrate WF between the container CT on the load port 110 and a buffer chamber 210 of the processing module 200. The transfer frame 120 may include an index robot 130 and an index rail 140. The index rail 140 may extend in the Y-direction. The index robot 130 is installed on the index rail 140 and may linearly move along the index rail 140 in the Y-direction.

The processing module 200 may include the buffer chamber 210, a transfer chamber 220, and a first process chamber CH1, a second process chamber CH2, a third process chamber CH3, and a fourth process chamber CH4. The transfer chamber 220 extends in the X-direction. In example embodiments, the first to fourth process chambers CH1, CH2, CH3, and CH4 may be spaced apart from each other in the Y-direction, with the transfer chamber 220 therebetween. In addition, the first to fourth process chambers CH1, CH2, CH3, and CH4 may be arranged in the X-direction. In other example embodiments, some of the first to fourth process chambers CH1, CH2, CH3, and CH4 may be stacked in the Z-direction.

The arrangement of the first to fourth process chambers CH1, CH2, CH3, and CH4 in the drawing is an example, and the first to fourth process chambers CH1, CH2, CH3, and CH4 may be arranged in other various manners. For example, all of the first to fourth process chambers CH1, CH2, CH3, and CH4 may be arranged only on one side of the transfer chamber 220.

The buffer chamber 210 may be arranged between the transfer frame 120 and the transfer chamber 220. The buffer chamber 210 may provide a space in which the substrate WF is stored between the transfer chamber 220 and the transfer frame 120. The buffer chamber 210 may include a plurality of slots that are internal spaces in which the substrate WF is stored. The plurality of slots may overlap each other and be spaced apart from each other in the Z-direction. The buffer chamber 210 may include an opening through which the substrate WF may enter and exit, respectively, in each of a surface thereof facing the transfer frame 120 and a surface thereof facing the transfer chamber 220.

The transfer chamber 220 may transfer the substrate WF between the buffer chamber 210 and the first to fourth process chambers CH1, CH2, CH3, and CH4. A guide rail 230 and the substrate transferring unit 300 may be located in the transfer chamber 220. The guide rail 230 may extend in the X-direction. The substrate transferring unit 300 may be installed on the guide rail 230 and may linearly move along the guide rail 230 in the X-direction. The substrate WF may be transferred between the first to fourth process chambers CH1, CH2, CH3, and CH4 by the substrate transferring unit 300.

A first blade 311 (see FIG. 4) that exclusively transfers the substrate WF that is in a dry state, a second blade 312 (see FIG. 4) that exclusively transfers the substrate WF that is in a wet state, and a carrier 330 temporarily storing the substrate WF that is in a dry state may configure a single substrate transferring unit 300 according to example embodiments. Details of the substrate transferring unit 300 are described later.

The first to fourth process chambers CH1, CH2, CH3, and CH4 may sequentially perform processes on one substrate WF. For example, after a developing process is performed on the substrate WF in the first process chamber CH1, a drying process may be performed on the substrate WF in the second process chamber CH2. Here, a developing process is a process of removing a photoresist in an exposed (or non-exposed) portion by extreme ultra-violet (EUV) light during an exposure process. A drying process may be performed by a processing fluid in a supercritical state. In example embodiments, the processing fluid in a supercritical state may include carbon dioxide ($CO_2$).

The first process chamber CH1 may supply a developer to the substrate WF that is in a dry state, by using a spraying device. The developer may be, for example, a non-polar organic solvent. The developer may be a liquid with which a soluble region of a photoresist for EUV may be selectively removed. For example, in the first process chamber CH1, due to the developer, the substrate WF in a dry state may be turned into the substrate WF in a wet state. A plurality of the first process chambers CH1 may be arranged in the processing module 200, and the number of first process chambers CH1 may be increased or decreased according to conditions such as the process efficiency and/or an installation area of the processing module 200.

The second process chamber CH2 may receive the substrate WF that is in a wet state, from the first process chamber CH1, and remove the developer by using a supercritical fluid on the substrate WF. According to related art, a method of rotating the substrate WF at a high speed is used, but a photoresist pattern for EUV may collapse due to surface tension during high-speed rotation. To address this, a developer may be dissolved in a supercritical fluid and then the supercritical fluid may be discharged to remove the developer. By removing both the developer and the supercritical fluid from the substrate WF as described above, the substrate WF in a wet state may be dried. For example, according to the drying process in the second process chamber CH2, the substrate WF in a wet state may be turned into the substrate WF in a dry state. A plurality of second process chambers CH2 may be arranged in the processing module 200, and the number of second process chambers CH2 may be increased or decreased according to the conditions such as the process efficiency and/or the installation area of the processing module 200.

The third process chamber CH3 may receive the substrate WF from the second process chamber CH2 and perform a baking process to completely dry the substrate WF. A baking process may be performed on the substrate WF at a temperature of about 120° C. to about 170° C. for about 30 seconds to about 120 seconds on a hot plate in the third process chamber CH3. For example, due to the baking process in the third process chamber CH3, the substrate WF may be maintained in a dry state.

The fourth process chamber CH4 may receive the substrate WF from the third process chamber CH3 and perform a cooling process to lower a temperature of the substrate WF. A cooling process may be performed on a cooling plate in the fourth process chamber CH4. For example, according to the cooling process in the fourth process chamber CH4, the substrate WF may be maintained in a dry state.

As such, according to the processes performed in the first to fourth process chambers CH1, CH2, CH3, and CH4, a condition of the substrate WF may be changed to a dry state or a wet state. A substrate transferring unit according to related art transfers a dry substrate and a wet substrate by using a common blade, without distinguishing between the states thereof. Accordingly, in a process of transferring a substrate in a wet state, the common blade may be contaminated due to a residual material of a developer remaining on the substrate. The contaminated common blade may cause a problem of re-contaminating other substrates in a dry state and/or other common blades.

The substrate processing apparatus 10 and the substrate transferring unit 300 included therein, according to the example embodiment, may include integrally as a single body a first blade 311 (see FIG. 4) exclusively transferring the substrate WF in a dry state and a second blade 312 (see FIG. 4) exclusively transferring the substrate WF in a wet state, to prevent re-contamination of the substrate WF due to a residual material of a developer. In addition, the substrate processing apparatus 10 and the substrate transferring unit 300 included therein according to the example embodiment also include a carrier 330 integrally as a single body and temporarily storing the substrate WF in a dry state, and thus, the substrate WF, which is in a dry state and is on standby for a process, may be stored without being re-contaminated.

According to the example embodiment, particle defects on the substrate WF during a manufacturing process of a semiconductor device may be significantly reduced. For example, contamination of the substrate WF and a blade due to a residual material of a developer may be prevented, and by providing the carrier 330, which may temporarily store the substrate WF in a dry state, the process efficiency and manufacturing yield of the substrate processing apparatus 10 may be improved.

Figure 2:
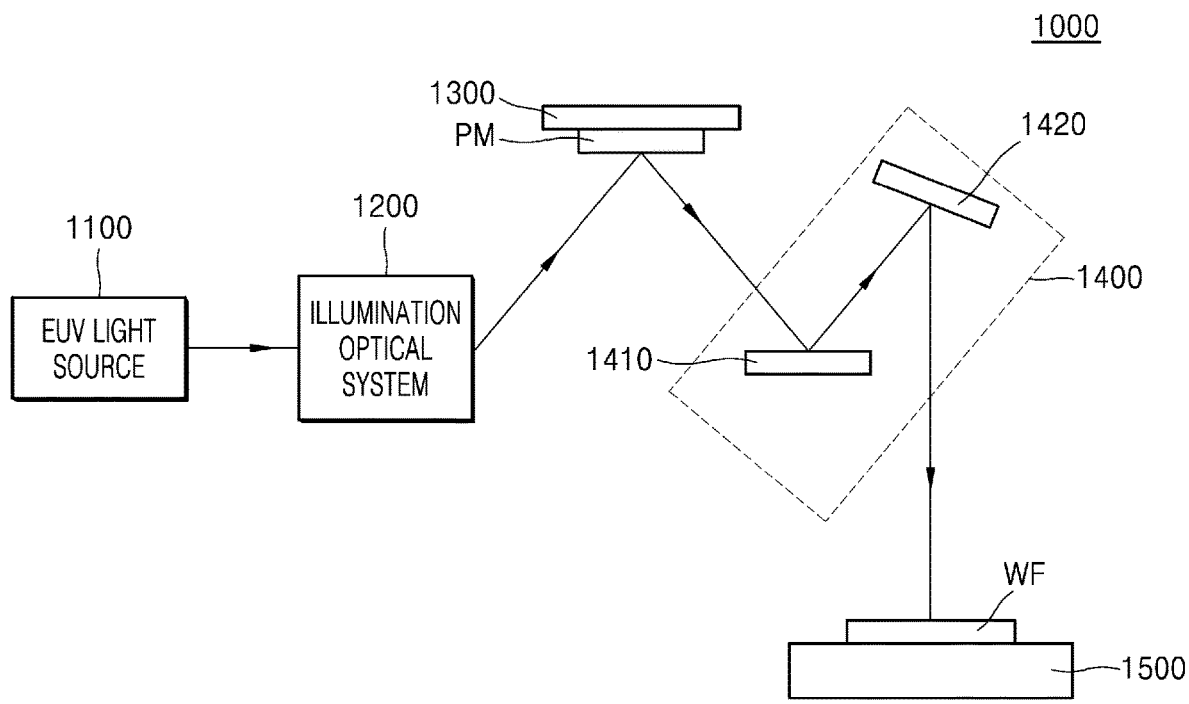
FIG. 2 is a conceptual diagram for describing extreme ultra-violet (EUV) exposure performed on a photoresist layer on a substrate.

FIG. 2 is a conceptual diagram for describing EUV exposure performed on a photoresist layer on a substrate.

Here, EUV exposure performed on a photoresist layer on the substrate WF fed to the substrate processing apparatus 10 described above (see FIG. 1) is described in detail.

Referring to FIG. 2, a EUV exposure apparatus 1000 may include a EUV light source 1100, an illumination optical system 1200, a photomask support 1300, a projection optical system 1400, and a substrate stage 1500.

The EUV light source 1100 may generate and output EUV light having a high energy density. For example, EUV light emitted from the EUV light source 1100 may have a wavelength of about 4 nm to about 124 nm. In some example embodiments, the EUV light may have a wavelength of about 4 nm to about 20 nm, and in particular, the EUV light may have a wavelength of 13.5 nm.

The EUV light source 1100 may be a plasma-based light source or a synchrotron radiation light source. Here, the plasma-based light source refers to a light source that generates plasma and uses light emitted by the plasma, and includes a laser-produced plasma light source, a discharge-produced d plasma light source, and the like.

The illumination optical system 1200 may include a plurality of reflection mirrors, and may transmit EUV light emitted from the EUV light source 1100 to a photomask PM for EUV. For example, EUV light emitted from the EUV light source 1100 may be reflected by a reflection mirror in the illumination optical system 1200 and may be incident on the photomask PM for EUV, arranged on the photomask support 1300.

The photomask PM for EUV may be a reflective mask having a reflective region and a non-reflective (or intermediate reflective) region. The photomask PM for EUV may include a reflective multilayer film formed on a mask substrate formed of a material having a relatively low coefficient of thermal expansion, such as silicon (Si), and an absorption pattern formed on the reflective multilayer film. Here, the reflective multilayer film may correspond to a reflective region, and the absorption pattern may correspond to a non-reflective (or intermediate reflective) region. Hereinafter, the reflective multilayer film and the absorption pattern are referred to as a reflective pattern.

The photomask PM for EUV may include a pellicle to protect the reflective pattern from physical and chemical contamination. The pellicle is arranged on the reflective pattern at certain intervals in order to protect a surface of the reflective pattern from external contamination.

The photomask PM for EUV reflects EUV light incident through the illumination optical system 1200 and makes the reflected EUV light be incident on the projection optical system 1400. For example, the photomask PM for EUV structures the light incident from the illumination optical system 1200 into projection light based on a shape of the reflective pattern on the mask substrate, and makes the light be incident on the projection optical system 1400. The projection light may be structured through at least a second order of diffraction due to the photomask PM for EUV. This projection light may be incident on the projection optical system 1400 while retaining information about a pattern shape of the photomask PM for EUV, and may pass through the projection optical system 1400 to form, on the substrate WF, an image corresponding to the pattern shape of the photomask PM for EUV.

The projection optical system 1400 may include a plurality of reflection minors 1410 and 1420. Although two reflection mirrors 1410 and 1420 are illustrated in the projection optical system 1400 in the drawing, embodiments are not limited thereto, and the projection optical system 1400 may include more than 2 reflection mirrors as illustrated in FIG. 2. For example, the projection optical system 1400 may include 4 to 8 reflection mirrors. However, the number of reflection mirrors included in the projection optical system 1400 is not limited thereto.

The substrate WF may be arranged on the substrate stage 1500. By movement of the substrate stage 1500, the substrate WF may also move in the same direction as the substrate stage 1500. The substrate WF, which has been processed in the EUV exposure apparatus 1000, may be fed into the substrate processing apparatus 10 described above (see FIG. 1).

Figure 3:
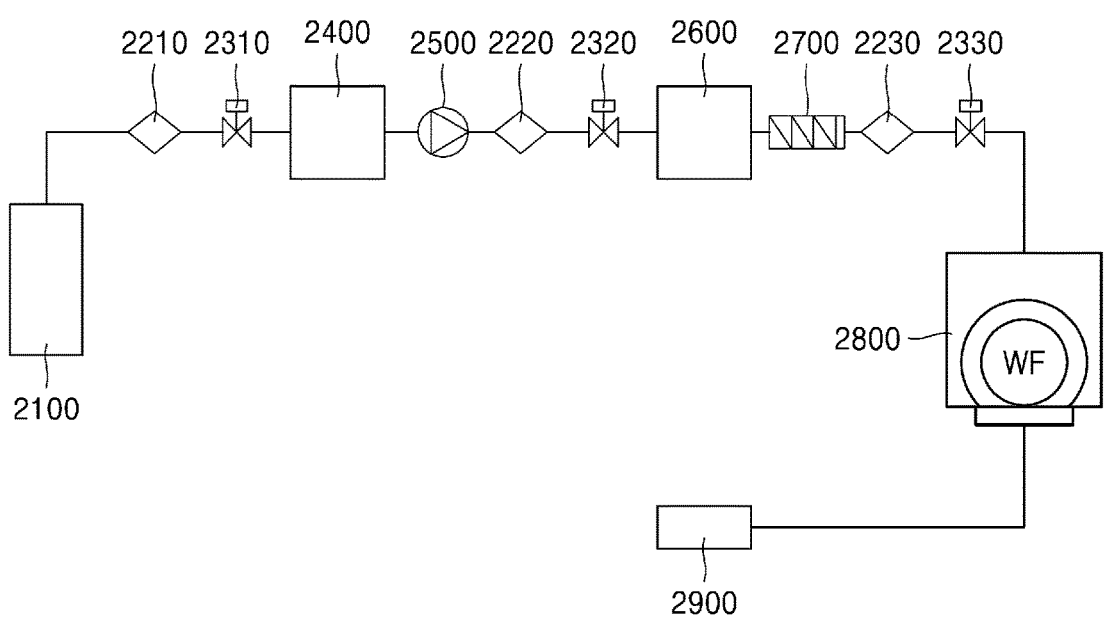
FIG. 3 is a conceptual diagram illustrating a substrate drying system in a substrate processing apparatus according to an example embodiment.

FIG. 3 is a conceptual diagram illustrating a substrate drying system in a substrate processing apparatus according to an example embodiment.

Here, a system for a process of removing a developer on the substrate WF fed into the substrate processing apparatus 10 (see FIG. 1) is described in detail.

Referring to FIG. 3, a substrate drying system 2000 may include a liquid tank 2100, a condenser 2400, a pump 2500, a storage tank 2600, a heater 2700, a substrate drying apparatus 2800, and a discharging apparatus 2900.

The substrate drying system 2000 may also include a plurality of filters and a plurality of valves. The plurality of filters may include, for example, a first filter 2210, a second filter 2220, and a third filter 2230, and the plurality of valves may include, for example, first to third valves 2310, 2320, and 2330, but the numbers thereof are not limited thereto. The first to third filters 2210, 2220, and 2230 may be used to remove impurities from a supercritical fluid, and the first to third valves 2310, 2320, and 2330 may be used to control the flow of the supercritical fluid.

The liquid tank 2100 may store, for example, liquid carbon dioxide. The condenser 2400 may convert a supercritical fluid or a gas into a liquid and remove impurities from the liquid. The pump 2500 may convert a liquid into a supercritical fluid by applying a pressure equal to or higher than a supercritical pressure to the liquid. The storage tank 2600 may store a supercritical fluid. The heater 2700 may maintain a supercritical fluid state by maintaining a temperature of the supercritical fluid at a critical temperature or higher by heating the supercritical fluid.

The supercritical fluid may be supplied to the substrate drying apparatus 2800. In the substrate drying apparatus 2800, the supercritical fluid may be used to dry the substrate WF. The substrate drying apparatus 2800 may correspond to the second process chamber CH2 (see FIG. 1). The supercritical fluid may dissolve the developer on the substrate WF. The supercritical fluid that has been used to dissolve the developer may be discharged from the substrate drying apparatus 2800 by the discharging apparatus 2900.

Figure 4:
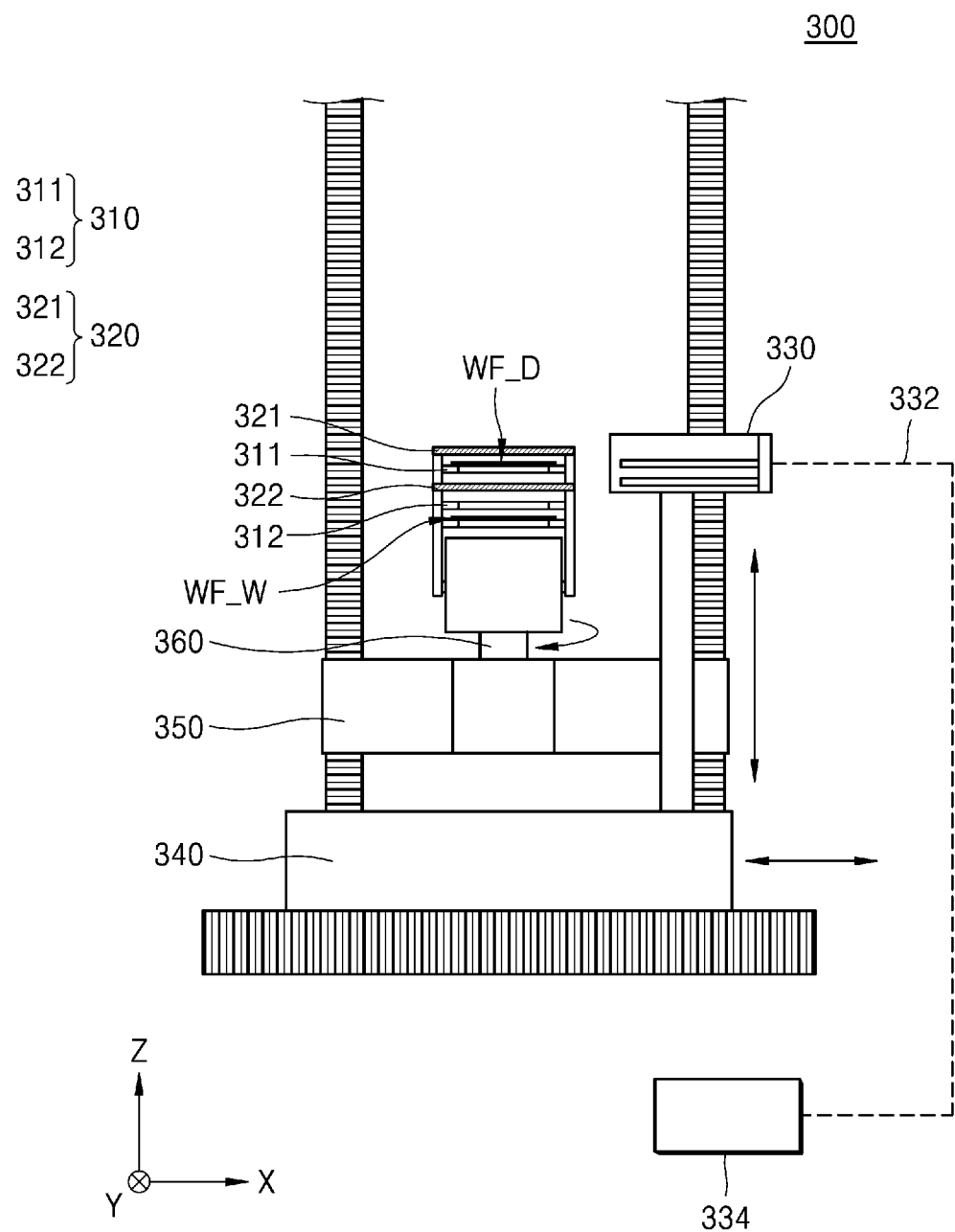
FIGS. 4 and 5 are schematic views illustrating a substrate transferring unit according to an example embodiment.
Figure 5:
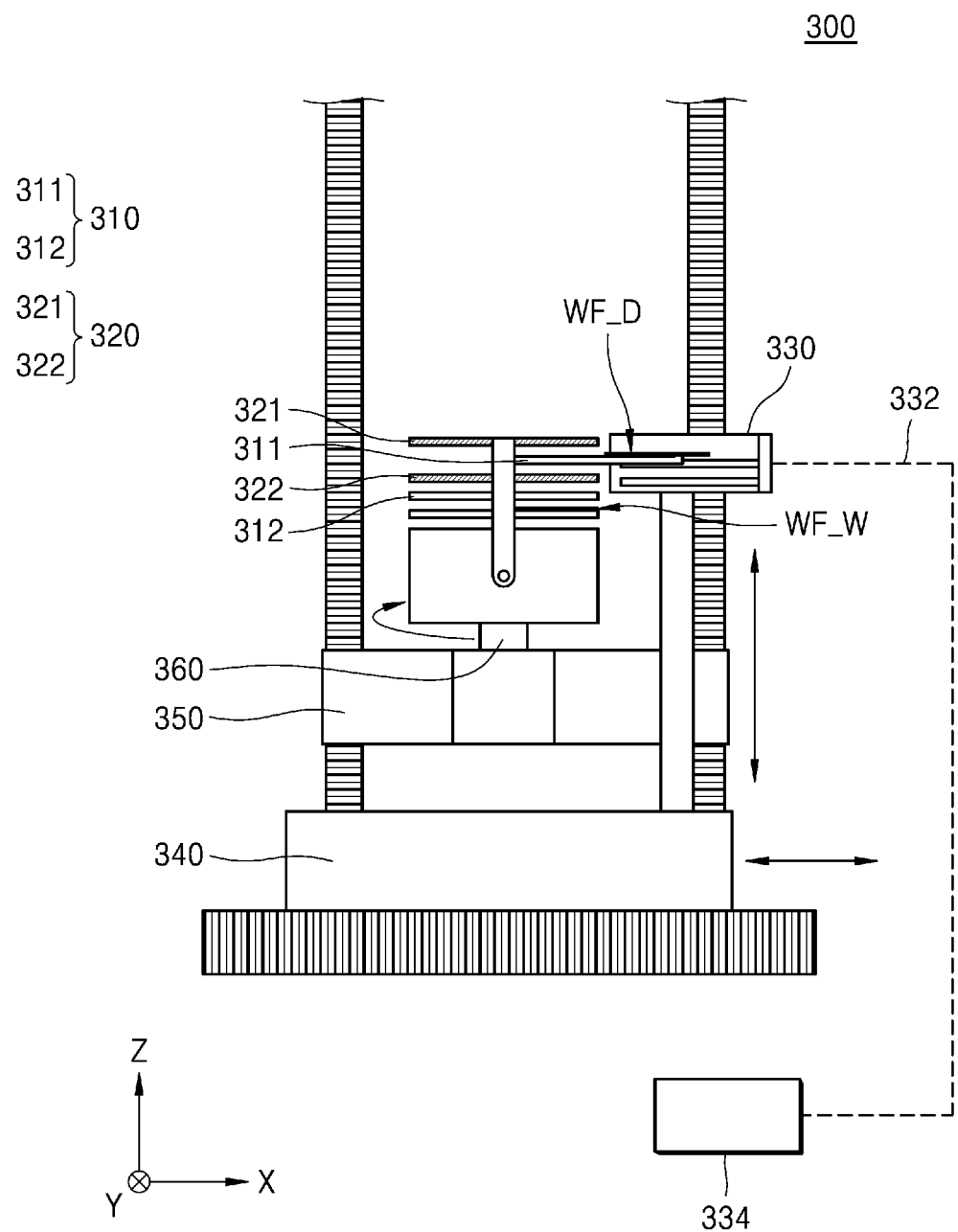

FIGS. 4 and 5 are schematic views illustrating a substrate transferring unit according to an example embodiment.

FIG. 4 is a front view of a blade 310 of the substrate transferring unit 300, and FIG. 5 is a side view of the blade 310 of the substrate transferring unit 300.

Referring to FIGS. 4 and 5 together, the substrate transferring unit 300 may include the blade 310, a cover 320, a carrier 330, and a first module (a first apparatus) 340, a second module (a second apparatus) 350, and a third module (a third apparatus) 360.

The blade 310 may include the first blade 311 transferring a substrate WF_D in a dry state and the second blade 312 transferring a substrate WF_W in a wet state. In detail, the first blade 311 may feed the substrate WF_D in a dry state, into the first process chamber CH1 (see FIG. 1), transferring the substrate WF_D in a dry state between the second to fourth chambers CH2, CH3, and CH4 (see FIG. 1), or transferring the substrate WF_D that is in a dry state and is on standby for a process, to the carrier 330. The second blade 312 may transfer the substrate WF_W in a wet state between the first process chamber CH1 (see FIG. 1) and the second process chamber CH2 (see FIG. 1).

In example embodiments, the first blade 311 may be arranged above the second blade 312. The number of first blades 311 may be equal to the number of second blades 312 or the number of first blades 311 may be less than the number of second blades 312.

The cover 320 may include a first cover 321 arranged above the first blade 311 and a second cover 322 arranged between the first blade 311 and the second blade 312. In detail, the first cover 321 may prevent air flowing from a fan filter unit (FFU) of a clean room in which the substrate processing apparatus 10 (see FIG. 1) is arranged, from directly contacting the substrate WF_D that is in a dry state and arranged on the first blade 311. The second cover 322 may prevent movement of contaminants between the first blade 311 and the second blade 312. For example, the second cover 322 may prevent a liquid from evaporating from the substrate WF_W that is in a wet state and arranged on the second blade 312, and being adsorbed onto the first blade 311 and/or a rear surface of the substrate WF_D in a dry state.

The carrier 330 constitutes a portion of the substrate transferring unit 300 and may temporarily store the substrate WF_D that is in a dry state. The substrate processing apparatus 10 (see FIG. 1) may include a plurality of first and second process chambers CH1 and CH2 (see FIG. 1), and each process period (for example, a period of performing a process, a start time, an end time, etc.) thereof vary. According to related art, the substrate WF_D in a dry state is temporarily stored on the blade 310 in an idle state. As a result, liquid may evaporate from the substrate WF_W in a wet state during the movement of the substrate transferring unit 300 to cause contamination of the substrate WF_D that is in a dry state. The substrate transferring unit 300 according to the example embodiment includes the carrier 330 that may temporarily store the substrate WF_D that is in a dry state, before feeding the same to a next process to prevent contamination of the substrate WF_D that is in a dry state.

The carrier 330 may include a cassette including a plurality of slots configured to support an edge of the substrate WF_D in a dry state. The plurality of slots may be spaced apart from each other inside the cassette in the Z-direction, and accordingly, a plurality of substrates WF_D, which are in a dry state, may be arranged inside the cassette in the Z-direction.

In example embodiments, the carrier 330 may include a purge nozzle 332 connected to the cassette and a gas supply 334 that may supply gas to the cassette through the purge nozzle 332. The gas may be, for example, air, a nitrogen ($N_2$) gas, or an inert gas, but is not limited thereto.

The first to third modules 340, 350, and 360 may perform different functions from each other. In detail, the first module 340 may move in the X-direction, and move the first blade 311, the second blade 312, and the carrier 330 coupled thereto in the X-direction. In addition, the second module 350 may move in the Z-direction, and move the first blade 311 and the second blade 312 coupled thereto in the Z-direction. For example, the carrier 330 may be fixed in the Z-direction. In addition, the third module 360 may rotate and thus rotate the first blade 311 and the second blade 312 coupled thereto. For example, the carrier 330 may be fixed without rotating.

The substrate transferring unit 300 according to the example embodiment may include the blade 310, the cover 320, the carrier 330, and the first to third modules 340, 350, and 360 that are configured as a single unit and integrally formed. For example, the first blade 311 and the second blade 312 are included in one substrate transferring unit 300 without configuring another unit, and thus, an area taken by the substrate transferring unit 300 may be relatively small.

Figure 6:
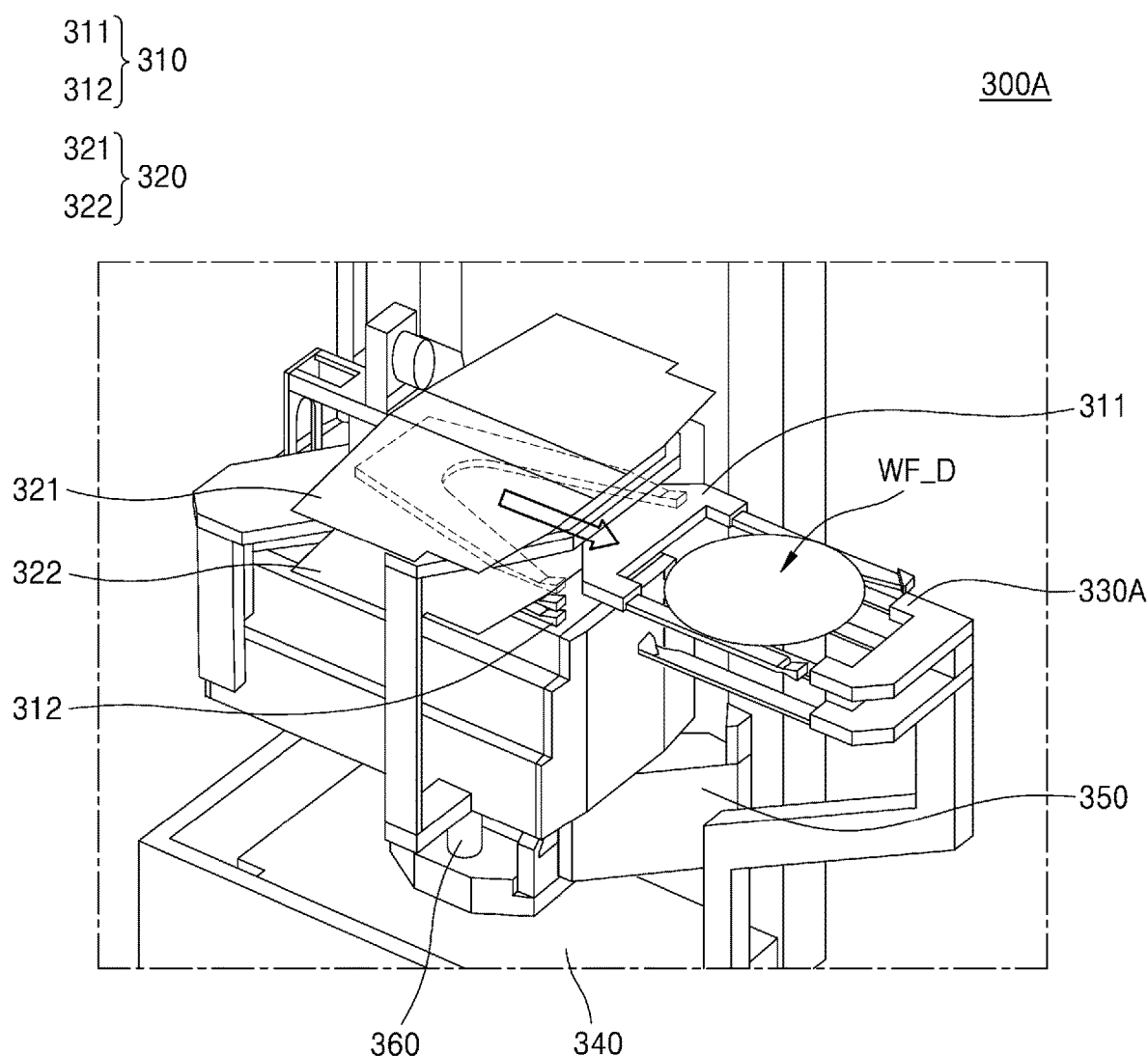
FIG. 6 is a perspective view illustrating a substrate transferring unit according to another example embodiment.

FIG. 6 is a perspective view illustrating a substrate transferring unit according to another example embodiment.

Most of components constituting a substrate transferring unit 300A described below and the arrangement of the components are substantially the same as or similar to those described with reference to FIGS. 4 and 5 above. Therefore, for convenience of description, the description will be focused on differences from the substrate transferring unit 300 described above.

Referring to FIG. 6, the substrate transferring unit 300A may include the blade 310, the cover 320, a carrier 330A, and the first to third modules 340, 350, and 360.

In the substrate transferring unit 300A according to the example embodiment, the carrier 330A may constitute a portion of the substrate transferring unit 300A, and may temporarily store the substrate WF_D that is in a dry state.

The carrier 330A may include a plurality of supports configured to support the edge of the substrate WF_D that is in a dry state. The plurality of supports may be arranged in an open space. The plurality of supports may be spaced apart from each other in a vertical direction, and thus, the plurality of substrates WF_D that are in a dry state may be respectively arranged on the plurality of supports in the vertical direction.

The substrate transferring unit 300A according to the example embodiment may include the blade 310, the cover 320, the carrier 330A, and the first to third modules 340, 350, and 360 that are configured as a single unit and integrally formed. For example, the first blade 311 and the second blade 312 are included in one substrate transferring unit 300A without configuring another unit, and the carrier 330A also includes a minimum number of components, and thus, an area taken by the substrate transferring unit 300A may be relatively small.

Figure 7:
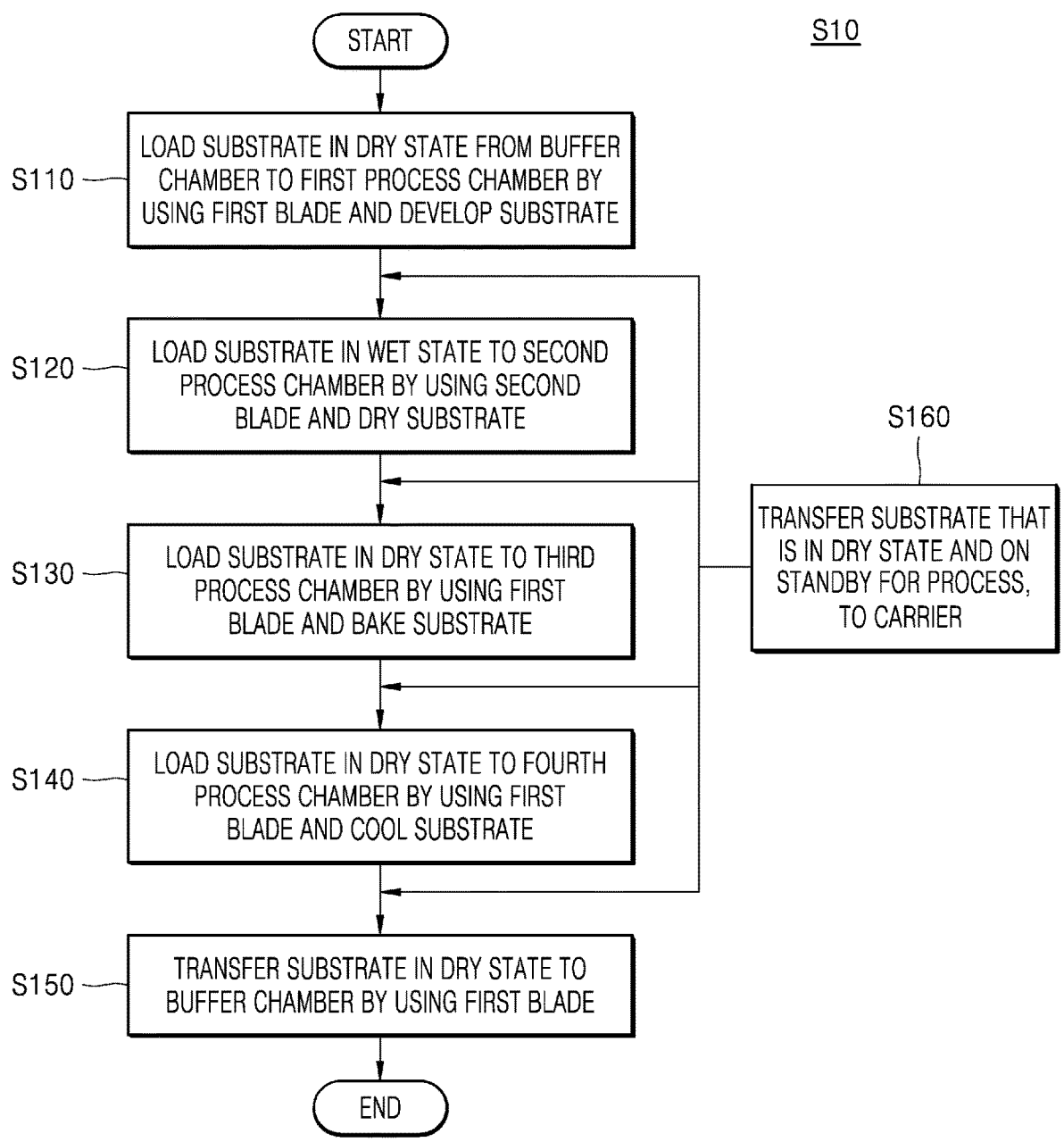
FIG. 7 is a flowchart of a substrate processing method according to an example embodiment.
Figure 8:
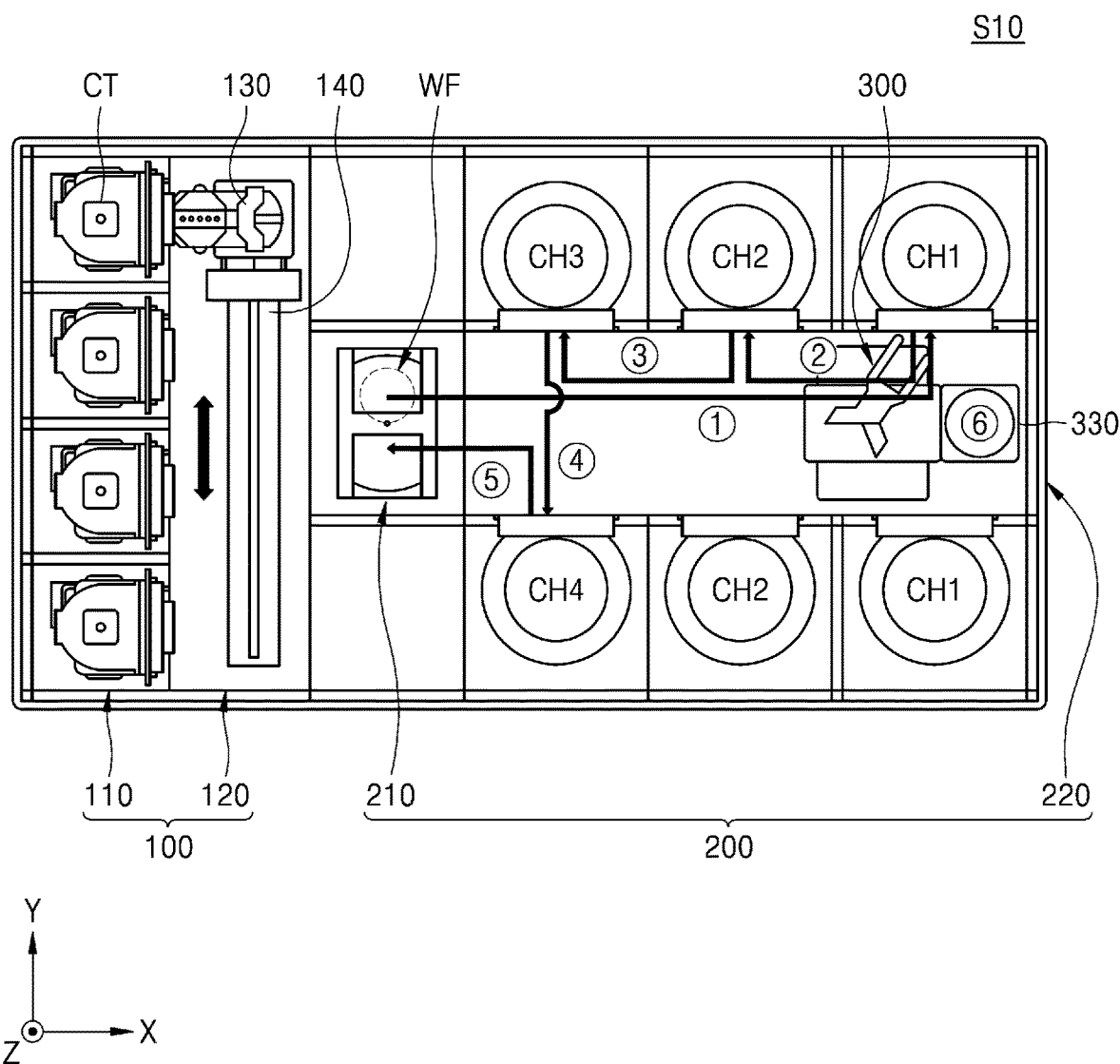
FIG. 8 is a schematic cross-sectional view of the substrate processing method of FIG. 7.

FIG. 7 is a flowchart of a substrate processing method according to an example embodiment, and FIG. 8 is a schematic cross-sectional view of the substrate processing method of FIG. 7.

Referring to FIGS. 7 and 8 together, a substrate processing method S10 may include a process order of first to sixth operations S110 to S160.

Where embodiments are otherwise implementable, a certain process order may be performed differently from the described order. For example, two processes that are consecutively described may be substantially and simultaneously performed or may be performed in an opposite order to the described order.

The substrate processing method S10 according to the example embodiment may be performed in the processing module 200 of the substrate processing apparatus 10 (see FIG. 1).

A series of processes performed in previous and subsequent operations of the processing module 200 will be understood with reference to the description with respect to FIG. 1, and thus, the description thereof is omitted herein.

First, a first operation (S110) may be performed, in which a developing process is performed by loading the substrate WF in a dry state from the buffer chamber 210, into the first process chamber CH1 by using the first blade 311 (see FIG. 4) of the substrate transferring unit 300.

Next, a second operation (S120) may be performed, in which a drying process is performed by loading the substrate WF, on which the developing process is performed and is in a wet state, into the second process chamber CH2 by using the second blade 312 (see FIG. 4) of the substrate transferring unit 300.

Next, a third operation (S130) may be performed, in which a baking process is performed by loading the substrate WF, on which the drying process is performed and is in a dry state, into the third process chamber CH3 by using the first blade 311 (see FIG. 4) of the substrate transferring unit 300.

Next, a fourth operation (S140) may be performed, in which a cooling process is performed on the substrate WF, on which the baking process is performed and is in a dry state, into the fourth process chamber CH4 by using the first blade 311 (see FIG. 4) of the substrate transferring unit 300.

Finally, a fifth operation (S150) may be performed, in which the substrate WF, on which the cooling process is performed and is in a dry state, is loaded into the buffer chamber by using the first blade 311 (see FIG. 4) of the substrate transferring unit 300.

According to necessity, in each of the first to fifth operations S110 to S150, a sixth operation (S160) of transferring, to the carrier 330, the substrate WF that is in a dry state and is on standby for a process, by using the first blade 311 (see FIG. 4) may be performed.

According to the example embodiment, contamination of the substrate WF and the blade by the residual material of the developer in the substrate processing apparatus 10 (see FIG. 1) may be prevented. In addition, as the substrate transferring unit 300 includes the carrier 330, which may temporarily store the substrate WF that is in a dry state, the process efficiency and manufacturing yield of the substrate processing method S10 may be improved.

Figure 9:
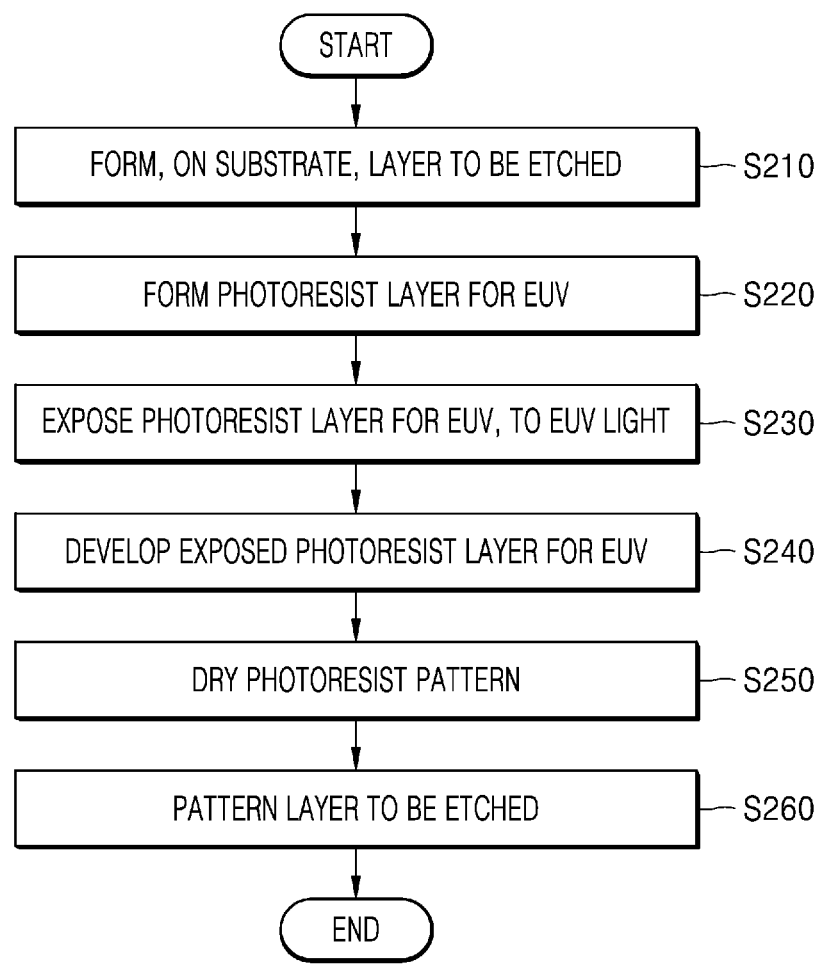
FIG. 9 is a flowchart of a method of forming fine patterns by using a substrate processing apparatus according to an example embodiment.

FIG. 9 is a flowchart of a method of forming fine patterns by using a substrate processing apparatus, according to an embodiment.

Referring to FIG. 9, a fine pattern forming method S20 may include the process order of first to sixth operations S210 to S260.

Where embodiments are otherwise implementable, a certain process order may be performed differently from the described order. For example, two processes that are consecutively described may be substantially and simultaneously performed or may be performed in an opposite order to the described order.

The fine pattern forming method S20 according to the example embodiment includes a first operation S210 of forming, on a substrate, a layer to be etched, a second operation S220 of forming a photoresist layer for EUV, a third operation S230 of exposing a photoresist layer for EUV, to EUV light, a fourth operation S240 of developing the exposed photoresist layer for EUV, a fifth operation S250 of drying a photoresist pattern, and a sixth operation S260 of patterning the layer to be etched.

The technical features of each of the first to sixth operations (S210 to S260) are described in detail with reference to FIGS. 10A to 10H to be described later.

FIGS. 10A through 10H are cross-sectional views illustrating the method of forming fine patterns of FIG. 9, in a process order.

Figure 10A:
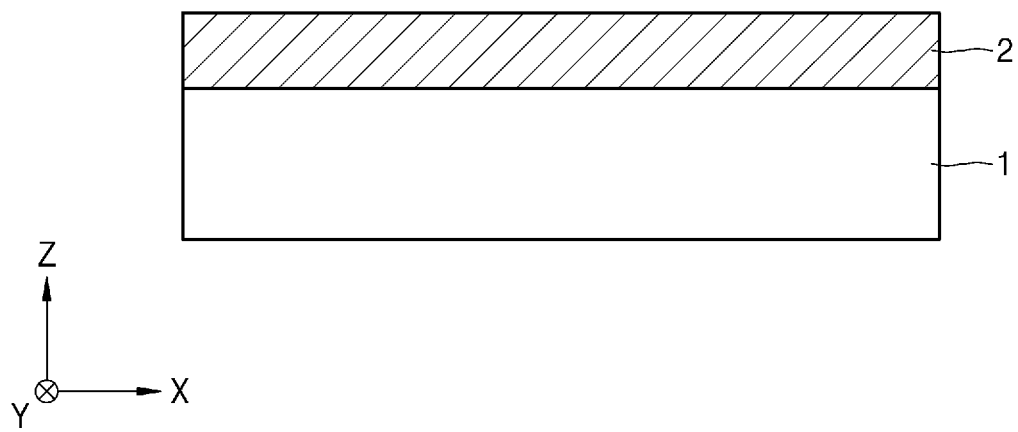
FIGS. 10A, 10B, 10C, 10D, 10E, 10F, 10G, and 10H are cross-sectional views illustrating the method of forming fine patterns of FIG. 9, in a process order.

Referring to FIG. 10A, a layer 2 to be etched may be formed on a substrate 1.

Hereinafter, the substrate 1 may correspond to the substrate WF described above with reference to FIGS. 1 to 8. The substrate 1 may be, for example, a silicon (Si) wafer including crystalline silicon, polycrystalline silicon, or amorphous silicon. According to another example embodiment, the substrate 1 may include a semiconductor element such as germanium (Ge), or a compound semiconductor such as silicon carbide (SiC), gallium arsenide (GaAs), indium arsenide (InAs), and indium phosphide (InP).

According to another example embodiment, the substrate 1 may have a silicon-on-insulator (SOI) structure. For example, the substrate 1 may include a buried oxide (BOX) layer. In example embodiments, the substrate 1 may include, as a conductive region, an impurity-doped well or an impurity-doped structure. In addition, the substrate 1 may include various device isolation structures such as a shallow trench isolation (STI).

Semiconductor devices such as transistors or diodes may be formed on the substrate 1. In addition, a plurality of wirings may be arranged in multiple layers on the substrate 1, and may be electrically isolated from each other by an interlayer insulating layer.

The layer 2 to be etched may include a conductive layer, a dielectric layer, an insulating layer, or a combination thereof. For example, the layer 2 to be etched may be formed of a metal, an alloy, a metal carbide, a metal nitride, a metal oxynitride, a metal oxycarbide, a semiconductor material, polysilicon, silicon oxide, silicon nitride, silicon oxynitride, or a combination thereof, but is not limited thereto.

Figure 10B:
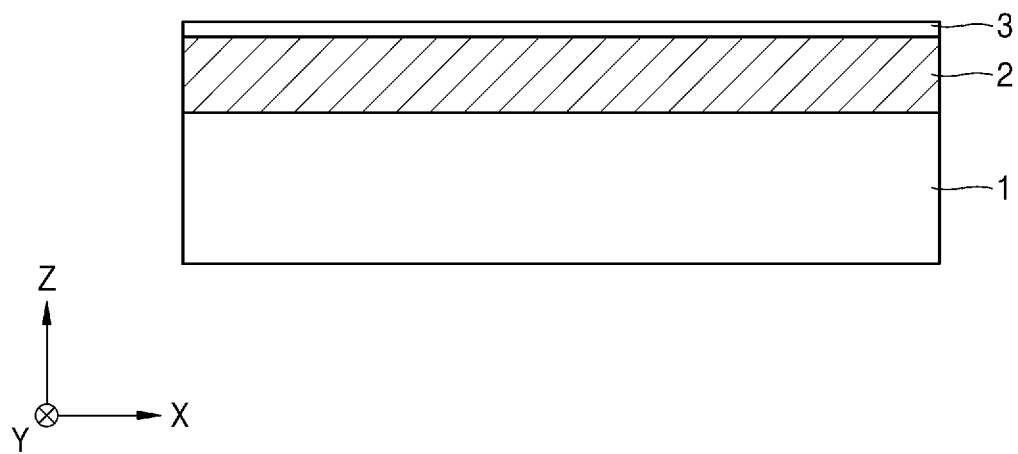

Referring to FIG. 10B, an anti-reflection layer 3 may be formed on the layer 2 to be etched.

The anti-reflection layer 3 may prevent total internal reflection of EUV light in a subsequent exposure process. The anti-reflection layer 3 may include an organic component having a light absorption structure and a solvent for dispersing the organic component. The light absorption structure may be, for example, a hydrocarbon compound having one or more benzene rings or having a structure in which benzene rings are fused.

The anti-reflection layer 3 may be formed by, for example, a spin coating process, but is not limited thereto.

Figure 10C:
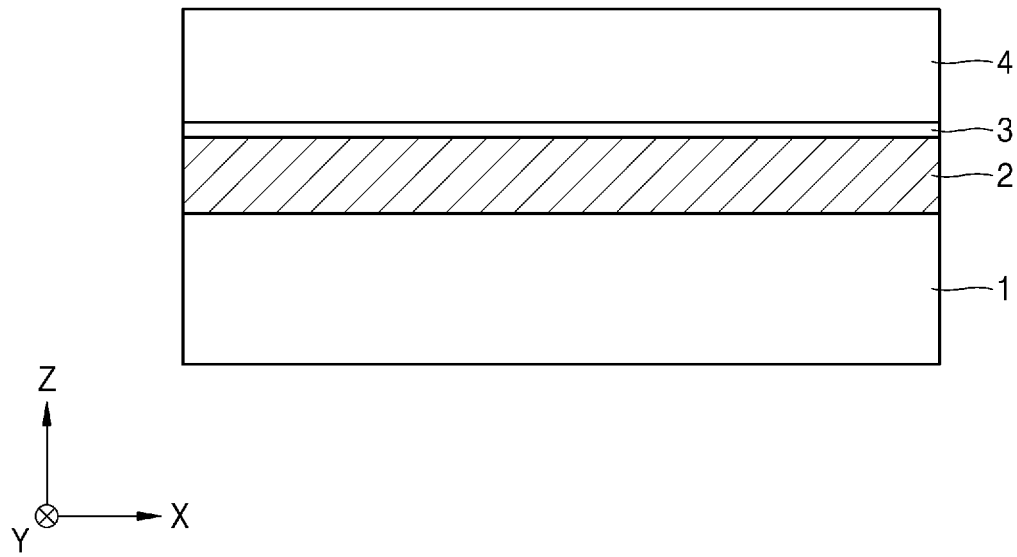

Referring to FIG. 10C, a photoresist layer 4 for EUV may be formed on the anti-reflection layer 3.

The photoresist layer 4 for EUV may be formed by a process such as spin coating, spray coating, dip coating, or the like. The photoresist layer 4 for EUV may be formed to have a thickness of, for example, about 30 nm to about 150 nm. After the photoresist layer 4 for EUV is formed, a soft baking process may be performed at a temperature of about 80° C. to about 130° C. for about 40 seconds to about 100 seconds.

Figure 10D:
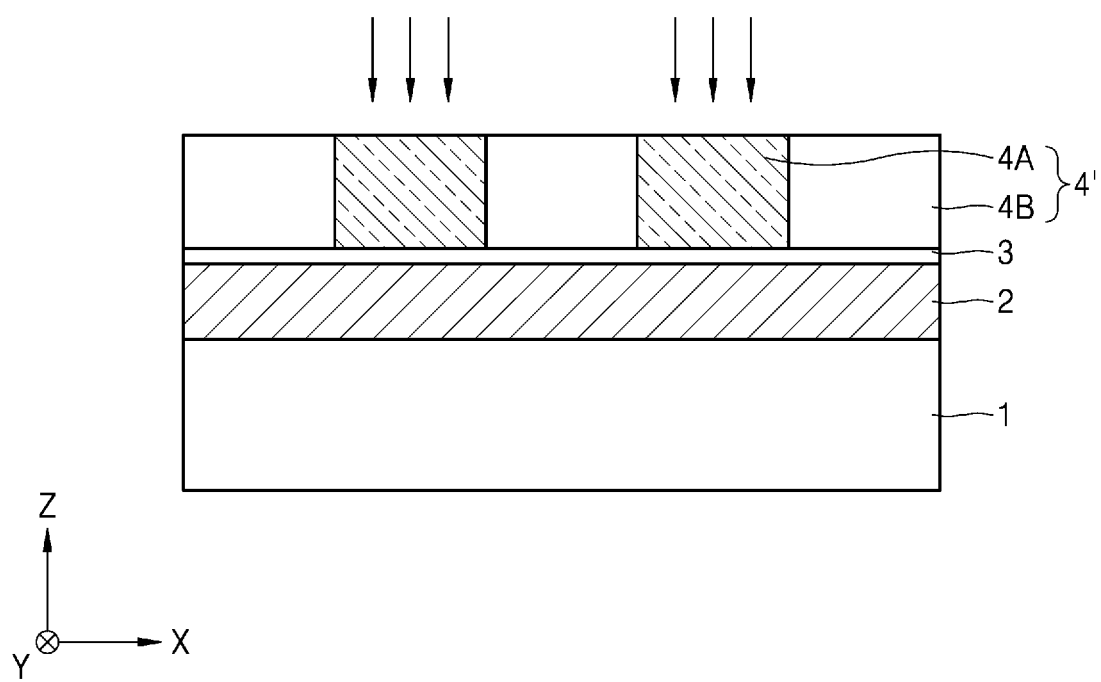

Referring to FIG. 10D, the EUV exposure apparatus 1000 (see FIG. 2) may be used to expose the photoresist layer 4 for EUV (see FIG. 10C).

According to a photoresist type, an exposed portion may be removed by development, or an unexposed portion may be removed by development. Hereinafter, a case in which an unexposed portion is removed by a negative tone developer (NTD) is described. However, embodiments are not limited thereto, and removing an exposed portion by using a positive tone developer (PTD) may also be performed.

An exposed photoresist layer 4' for EUV may be divided into an exposed portion 4A and a non-exposed portion 4B. In the exposed portion 4A, EUV light generates an acid from a photo-acid generator included in the exposed photoresist layer 4' for EUV, thereby causing deprotection of a photosensitive polymer. Because the non-exposed portion 4B is not irradiated with EUV light, the above chemical reaction does not occur.

Figure 10E:
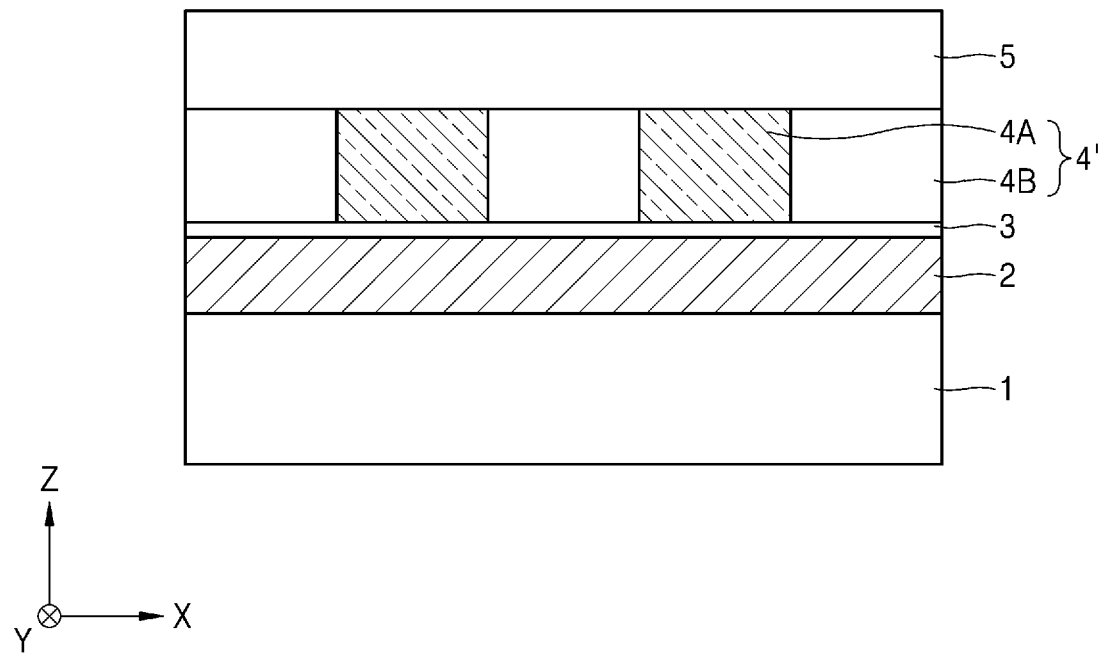

Referring to FIG. 10E, the exposed photoresist layer 4' for EUV may be developed.

The exposed photoresist layer 4' for EUV may be developed using a developer such as a non-polar organic solvent. In order to develop the exposed photoresist layer 4' for EUV, a developer layer 5 may be formed on the exposed photoresist layer 4' for EUV. As a developer of the developer layer 5 has good miscibility with polymers that are not exposed to EUV light and retain protective groups, an unexposed portion is dissolved in the developer layer 5. In addition, a portion exposed to EUV light is not protected, and thus, miscibility thereof with the developer is relatively poor.

Figure 10F:
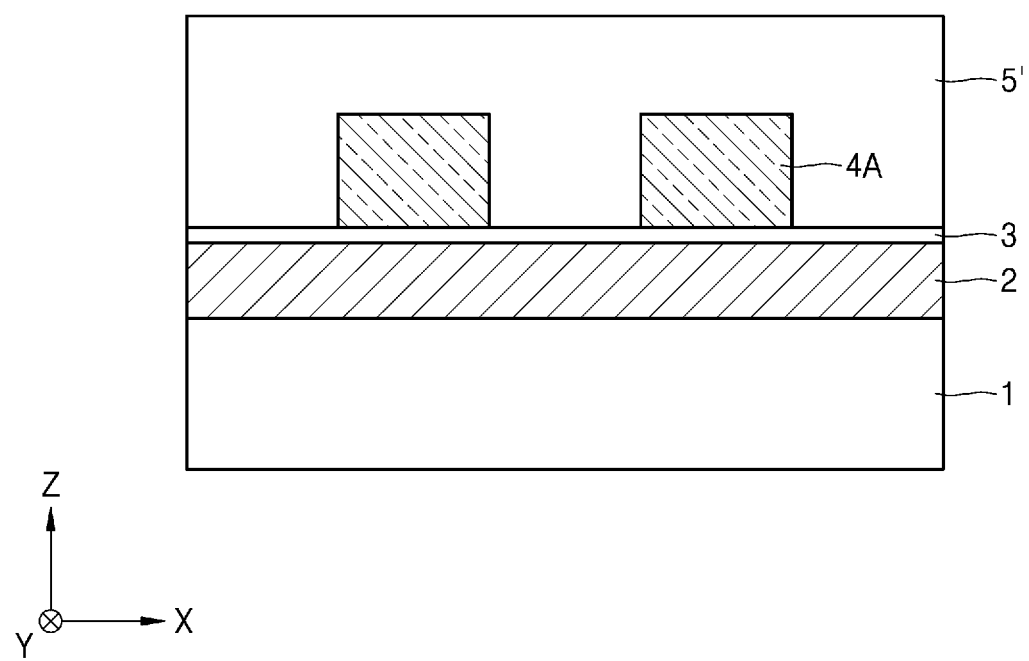

Referring to FIG. 10F, a developer layer 5', in which the unexposed portion 4B is dissolved and mixed, may be obtained.

The exposed portion 4A may remain in its original state because the exposed portion 4A is not dissolved in the developer of the developer layer 5' including a mixture. The exposed portion 4A may be surrounded by the developer layer 5' including the mixture.

Figure 10G:
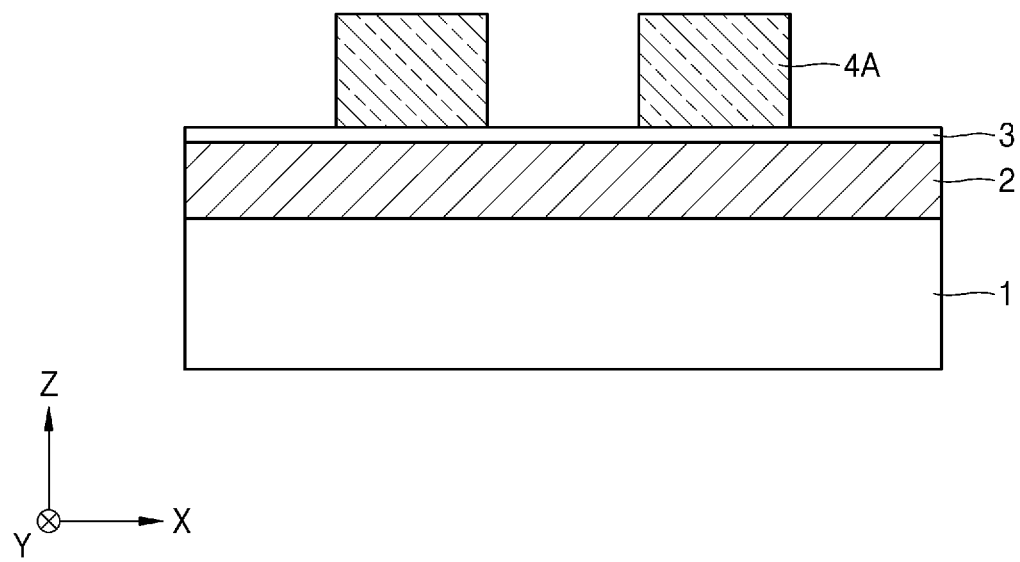

Referring to FIG. 10G, the developer layer 5' including the mixture (see FIG. 10F) may be removed to expose the exposed portion 4A.

In example embodiments, a baking process may be performed on the exposed portion 4A. The baking of the exposed portion 4A may be performed at a temperature of about 120° C. to about 170° C. for about 30 seconds to about 120 seconds, but is not limited thereto.

Figure 10H:
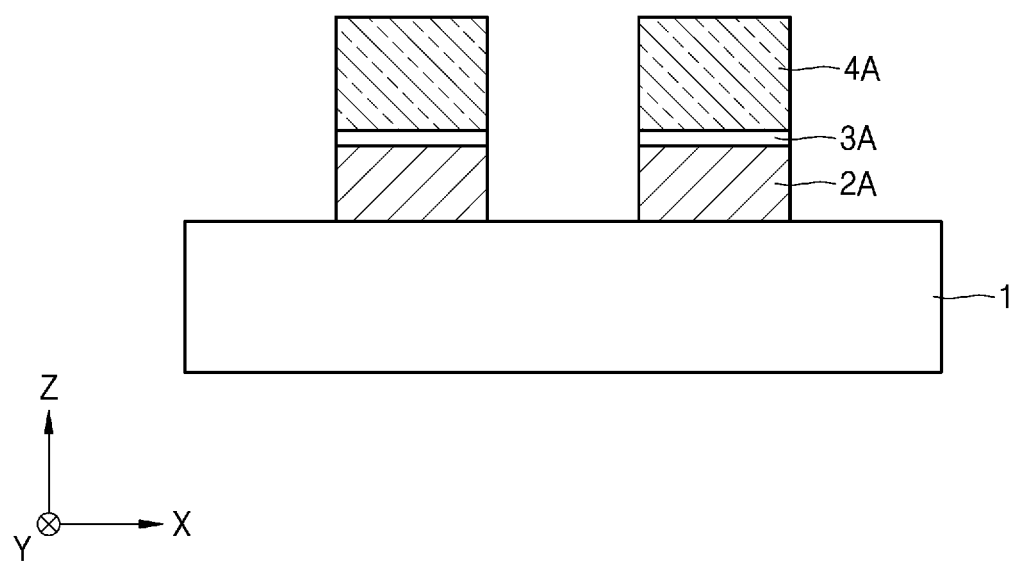

Referring to FIG. 10H, a fine pattern 2A may be formed by patterning the layer 2 to be etched (see FIG. 10G) by anisotropic etching using the exposed portion 4A as an etch mask.

The layer 2 to be etched (see FIG. 10G) may be patterned by a process such as plasma etching, reactive ion etching (RIE), or ion beam etching. The anti-reflection layer 3 (see FIG. 10G) may be removed by leaving a remaining portion 3A.

By removing the exposed portion 4A and the remaining portion 3A on the fine pattern 2A, a desired fine pattern 2A may be obtained. The fine pattern 2A may have a width of about 5 nm to about 20 nm. In example embodiments, the fine pattern 2A may have a width of about 3 nm to about 20 nm, but is not limited thereto.

The fine pattern 2A may constitute various elements necessary for the implementation of an integrated circuit device. For example, the fine pattern 2A may be an active region defined on the substrate 1 of a semiconductor device. According to another example embodiment, the fine pattern 2A may include a plurality of contact hole patterns or line and space patterns.

The fine pattern 2A may include a conductive pattern or an insulating pattern. For example, the conductive pattern may constitute a pattern for forming a bit line, a pattern for forming a direct contact, a pattern for forming a buried contact, and a pattern for forming a capacitor lower electrode, wherein the patterns are arranged in a cell array region of an integrated circuit device, or a conductive pattern arranged in a core region of an integrated circuit.

While example embodiments have been described with reference to the figures, it will be understood by those of ordinary skill in the art that various changes in form and details may be made therein without departing from the spirit and scope as defined by the following claims and their equivalents.

What is claimed is:

1. A substrate transferring unit comprising:
   a first blade configured to transfer a substrate that is in a dry state;
   a second blade provided below the first blade and configured to transfer the substrate that is in a wet state;
   a first cover provided above the first blade;
   a second cover provided between the first blade and the second blade; and
   a carrier configured to temporarily store the substrate that is in the dry state,
   wherein the carrier comprises:
      a cassette accommodating a plurality of substrates; and
      a purge nozzle through which gas is injected into the cassette.

2. The substrate transferring unit of claim 1, further comprising:

a first module configured to move in a horizontal direction to operate the first blade, the second blade, and the carrier, and wherein a second module configured to move in a vertical direction to operate the first blade and the second blade.

3. The substrate transferring unit of claim 1, further comprising first blades and second blades, wherein a number of the second blades is greater than or equal to a number of the first blades.

4. The substrate transferring unit of claim 1, wherein the carrier comprises a plurality of supports configured to accommodate the substrate in an exposed state.

* * * * *